United States Patent
Biber et al.

(10) Patent No.: US 9,255,977 B2
(45) Date of Patent: Feb. 9, 2016

(54) LOCAL COIL

(71) Applicants: Stephan Biber, Frauenaurach (DE);
Karsten Jahns, Buckenhof (DE);
Thomas Kundner, Buckenhof (DE);
Joerg Rothard, Litzendorf (DE)

(72) Inventors: Stephan Biber, Frauenaurach (DE);
Karsten Jahns, Buckenhof (DE);
Thomas Kundner, Buckenhof (DE);
Joerg Rothard, Litzendorf (DE)

(73) Assignee: Siemens Aktiengesellschaft, München (DE)

(*) Notice: Subject to any disclaimer, the term of this patent is extended or adjusted under 35 U.S.C. 154(b) by 561 days.

(21) Appl. No.: 13/683,469

(22) Filed: Nov. 21, 2012

(65) Prior Publication Data
US 2013/0127469 A1  May 23, 2013

(30) Foreign Application Priority Data
Nov. 22, 2011 (DE) .......................... 10 2011 086 832

(51) Int. Cl.
*G01R 33/36* (2006.01)
*G01R 33/34* (2006.01)
*G01R 33/3415* (2006.01)

(52) U.S. Cl.
CPC .......... *G01R 33/36* (2013.01); *G01R 33/34084* (2013.01); *G01R 33/34007* (2013.01); *G01R 33/3415* (2013.01)

(58) Field of Classification Search
CPC ....................................................... G01R 33/36
USPC ........................................................ 324/322
See application file for complete search history.

(56) References Cited

U.S. PATENT DOCUMENTS

| | | | |
|---|---|---|---|
| 5,261,403 A * | 11/1993 | Saito et al. ..................... | 600/422 |
| 5,361,765 A | 11/1994 | Herlihy et al. | |
| 6,349,412 B1 * | 2/2002 | Dean ................................. | 2/102 |
| 6,438,402 B1 * | 8/2002 | Hashoian et al. ............ | 600/410 |
| 6,778,849 B1 | 8/2004 | Ninomiya et al. | |
| 6,943,551 B2 | 9/2005 | Eberler et al. | |
| D686,324 S * | 7/2013 | Davis et al. ................... | D24/158 |
| 8,653,820 B2 * | 2/2014 | Dohata et al. ................. | 324/318 |
| 2002/0151788 A1 * | 10/2002 | Menon .......................... | 600/421 |
| 2004/0106336 A1 * | 6/2004 | Menon et al. ................. | 439/894 |
| 2004/0183534 A1 * | 9/2004 | Chan et al. .................... | 324/318 |
| 2005/0107686 A1 * | 5/2005 | Chan et al. .................... | 600/422 |
| 2008/0180101 A1 * | 7/2008 | Bradshaw et al. ............ | 324/318 |
| 2008/0204021 A1 * | 8/2008 | Leussler et al. ............... | 324/318 |
| 2010/0301862 A1 * | 12/2010 | Tropp et al. ................... | 324/318 |
| 2012/0161768 A1 * | 6/2012 | Hardy et al. .................. | 324/318 |
| 2012/0293174 A1 * | 11/2012 | Taracila et al. ............... | 324/318 |

FOREIGN PATENT DOCUMENTS

| DE | 102005024325 A1 * | 8/2006 |
|---|---|---|
| DE | 103 14 215 B4 | 11/2006 |

OTHER PUBLICATIONS

German Office Action dated Jun. 6, 2012 for corresponding German Patent Application No. DE 10 2011 086 832.1 with English translation.

* cited by examiner

*Primary Examiner* — Rodney Fuller
(74) *Attorney, Agent, or Firm* — Lempia Summerfield Katz LLC

(57) ABSTRACT

A local coil for an imaging system includes an anterior torso part and a posterior torso part that are detachably connected to one another with a fastening device.

32 Claims, 11 Drawing Sheets

LOCAL COIL

This application claims the benefit of DE 10 2011 086 832.1, filed on Nov. 22, 2011, which is hereby incorporated by reference.

BACKGROUND

The present embodiments relate to a local coil for a magnetic resonance tomography (MRT).

Magnetic resonance devices (MRTs) for examining objects or patients using magnetic resonance tomography are known, for example, as disclosed by DE10314215B4.

In MR tomography, images with a high signal-to-noise ratio (SNR) may be recorded using local coils (e.g., coils). The local coils are antenna systems that may be attached directly on (anterior) or below (posterior) the patient. With an MRT measurement, the excited nuclei induce a voltage into the individual antennae of the local coil. The voltage is then amplified with a low-noise preamplier (LNA, preamp) and is forwarded to the receiving electronics via a cable. High field systems (e.g., 1.5 T to 12 T and more) may be used to improve the signal-to-noise ratio even with highly resolved images.

Of importance in many clinical MR applications is the SNR (signal-to-noise ratio) of an image. The SNR may be decisively determined by the local coil (e.g., antenna with active amplifiers) and by the losses in the antenna elements themselves. Very small antennas allow for a very high SNR close to the antenna. Due to the possibility of the accelerated measurement by k-space subscanning (e.g., parallel imaging, SENSE, GRAPPA), there is a great interest in high-channel, very compact antenna arrays. The individual elements of such high channel, compact antenna arrays may have a totally different alignment relative to the transmit field. In addition to the SNR, the simple usability of the local coil is also an important property of the component. During the time used to apply and position the local coil, the MR system may not be used in any other way. A favorable arrangement of local coil elements together with a workflow-optimized mechanical design is key to the simultaneous optimization of SNR and workflow.

Local coils exist in various designs. Local coils may be dedicated to specific body regions (e.g., the head, heart, prostate, knee, ankle, or shoulder joint) of a patient.

Mechanically flexible local coils adapt to the body, and the SNR is improved due to close proximity to the patient. For example, the variability of patient anatomies is very high in the abdomen and thorax area, making a flexible adaptation of the local coil in at least one direction advantageous.

Flexible coils may be manufactured from mechanically flexible antenna supports. Mechanically flexible antenna supports are incorporated in flexible foam materials. Additional areas for electronics may be rigid, but most are so small that sufficient space remains between for the antennae to bend. Anterior coils to image, for example, the heart or abdomen may be attached to a top side of the patient after he/she has laid on the patient couch. The coils may be fixed to the couch by strips or may rest on the couch due to the high dead weight of the coils.

Problems of known local coils may include that the lateral coverage of the patient with local coils may not be optimal due to the subsequent attachment of the coils. The coils may protrude slightly from the surface. A gap may be produced between posterior coil elements (e.g., a spine coil) permanently integrated into a table and anterior coil elements (e.g., see Sp in FIG. 1). Such arrangements may be less than optimal (e.g., for cardiology imaging), since the heart is positioned slightly laterally offset in the body, making lateral coverage important. Fixing the anterior coil to the patient couch with a belt may cause claustrophobic patients to experience anxiety, since he/she is fixed to the patient couch in a certain way (see FIG. 1). Attaching the coil after positioning the patient on the table may be time-consuming for the user and requires additional installation time (see FIG. 2). Once the patient is on the couch, the coil is to be initially fetched (e.g., coil trolley) and placed and aligned on the patient. In the case of overweight patients, the user may potentially have to move around the couch in order to fasten the belts, thereby increasing the expenditure of time for fastening approximately four belts.

The arrangement of the posterior elements and the anterior elements is not rigidly predetermined because posterior and anterior coils are mechanically separated. A fixed element arrangement may be advantageous to the optimization of the antenna arrays with respect to parallel imaging and contribute to the more efficient use of system resources (e.g., number of channels and computing time).

SUMMARY AND DESCRIPTION

The present embodiments may obviate one or more of the drawbacks or limitations in the related art. For example, a local coil such as an abdominal local coil may be optimized for a magnetic resonance tomography (MRT).

In one embodiment, a local coil is configured as an abdomen coil that may be worn as a piece of upper body clothing (e.g., in the form of a vest or jacket) prior to positioning a patient on a patient couch. Aside from saving set-up time, a local coil of this type may optimize the signal-to-noise ration (SNR) upon receipt of signals due to the easily adjustable anatomic fit for various patient geometries.

In another embodiment, a local coil may be advantageous in that a patient may "wear" the local coil before he/she lies on the couch.

In another example, a local coil may be configured to be mechanically flexible and may include antennas and additional electronics such as, for example, a preamplifer, a mixer, an analog-to-digital converter (ADC) and a detuning circuit.

In another embodiment, a local coil covers the patient from at least three, and possibly all four sides except for the sides in the longitudinal direction +−z (e.g., at the head or foot) depending on the build of the patient.

For optimal adaptation to the body geometry, the local coil may have one or two openings for one or both arms to pass through (e.g., when the patient to be examined "wears" the local coil) and/or two or three closing mechanisms to adapt the local coil to the respective patient. These mechanisms may be embodied, for example, as belts that may be adjusted in terms of length or as mechanically flexible elements (e.g., made of rubber or a springy material).

In another embodiment, a local coil may be adaptable to individual anatomies of different patients by adjustable belts or similar solutions (e.g., on the shoulder in the cranial direction and/or laterally at hip height). A first mechanism enables the local coil to rest sufficiently high and the coil elements of the local coil to be well positioned below the armpit of a patient to be examined. A second mechanism may provide that the local coil rests closely around the patient in the peripheral direction.

The problems cited in the introduction thus may be reduced in accordance with exemplary embodiments, because the positioning and fastening measures may take place prior to the examination and outside of the examination room. As a result, installation and personnel costs for an examination on account of corresponding time savings may be reduced.

In another embodiment, a part of the local coil lies between the abdomen and the arm and a shoulder molding. A geometric molding of the local coil may be arranged in accordance with, for example, the described and illustrated 2D implementation.

DETAILED DESCRIPTION OF THE DRAWINGS

Figure 11:
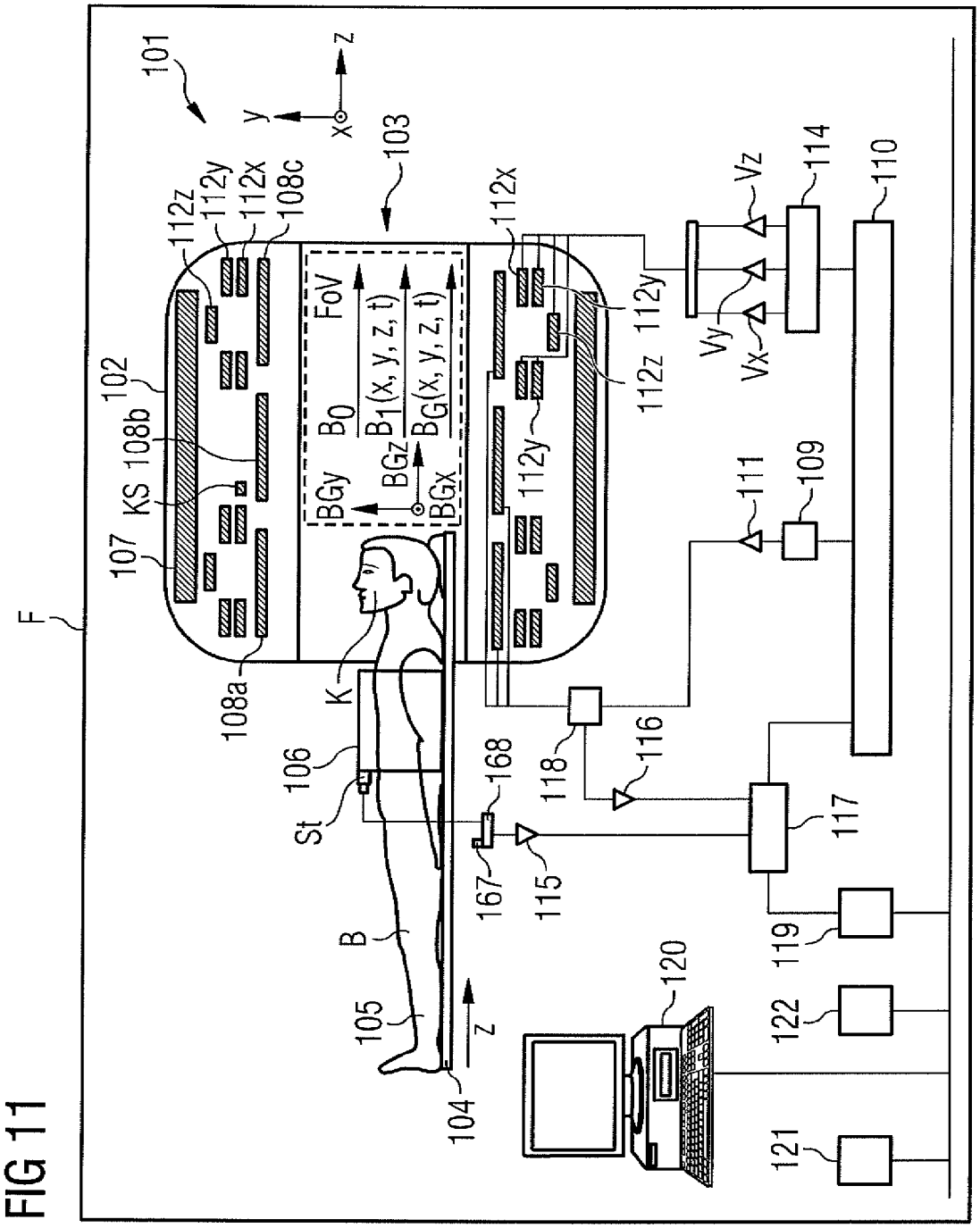
FIG. 11 shows a schematic representation of one embodiment of an MRT system.

FIG. 11 shows, as background, a magnetic resonance imaging device MRT 101 located in a shielded room or Faraday cage F. The imaging device 101 has a whole body coil 102 with a tubular space 103, in which, for example, a patient couch 104 with a body 105 (e.g., of an examination object such as a patient with or without a local coil arrangement 106) may be moved in the direction of the arrow z in order to generate recordings of the patient 105 using an imaging method. A local coil arrangement 106 $t$, with which, in a local field (e.g., field of view or FOV) of the imaging device MRT 101, recordings of a subarea of the body 105 may be generated in the FOV, is, for example, arranged on the patient. Signals from the local coil arrangement 106 may be evaluated by an evaluation device or system (e.g., including elements 168, 115, 117, 119, 120, and 121) of the MRT 101. The evaluation device may be connected to the local coil arrangement 106 via coaxial cables or radio (e.g., element 167), for example, and converted into images, stored or displayed.

To examine the body 105 (e.g., the examination object or the patient) using the magnetic resonance imaging device MRT 101 by magnetic resonance imaging, different magnetic fields are attuned as precisely as possible to one another in terms of temporal and spatial characteristics and are irradiated onto the body 105. A strong magnet (e.g., a cryomagnet 107) in a measuring cabin with a tunnel-type opening 103, for example, generates a strong static main magnetic field $B_0$. The value of the main magnetic field $B_0$ may be, for example, 0.2 Tesla to 3 Tesla or greater. The body 105 to be examined is moved into an approximately homogenous area of the main magnetic field $B_0$ in the field of view when mounted on the patient couch 104. Excitation of the nuclear spin of atomic nuclei of the body 105 is caused by high frequency magnetic excitation pulses B1 (x, y, z, t) that are irradiated by high frequency antennae and/or, optionally, a local coil arrangement, as shown in FIG. 11 in a simplified form as body coils 108 (e.g., a multipart body coil 108$a$, 108$b$, 108$c$). High frequency excitation pulses are generated, for example, by a pulse generation unit 109 controlled by a pulse sequence control unit 110. After amplification by a high frequency amplifier 111, the high frequency excitation pulses are routed to the high frequency antennae 108. The high frequency system shown in FIG. 11 is only indicated schematically. In other embodiments, more than one pulse generation unit 109, more than one high frequency amplifier 111, and several high frequency antennae 108 $a$, 108$b$, 108$c$ may be used in the magnetic resonance imaging device 101.

The magnetic resonance device 101 has gradient coils 112$x$, 112$y$, 112$z$. During measurement, magnetic gradient fields are irradiated with the gradient coils 112$x$, 112$y$, 112$z$ for selective layer excitation and local encoding of the measurement signal. The gradient coils 112$x$, 112$y$, 112$z$ are controlled by a gradient coil control unit 114 that is connected to the pulse sequence control unit 110 similarly to the pulse generation unit 109.

Signals emitted by the excited nuclear spin of the atomic nucleus in the examination object are received by the body coil 108 and/or at least one local coil arrangement 106. The signals are amplified by an assigned high frequency preamplifier 116 and further processed and digitalized by a receiving unit 117. The measurement data detailed is digitalized and stored as complex numerical values in a k-space matrix. An associated MR image may be reconstructed from the k-space matrix occupied with values by a multi-dimensional Fourier transformation.

For a coil that may be operated both in the transmit and also in the receive mode (e.g., the body coil 108 or a local coil 106), the correct signal forwarding is controlled by an upstream transmit-receive switch 118.

An image processing unit 119 generates an image from measurement data. The image is shown to a user via a console terminal 120 and/or is stored in a storage unit 121. A central computing unit 122 controls the individual system components.

In MR tomography, images with a high signal-to-noise ratio (SNR) may be recorded with local coil arrangements (coils, local coils). The local coils arrangements are antenna systems attached directly on (anterior), below (posterior), on or in the body 105. With an MR measurement, the excited nuclei induce a voltage into the individual antennae of the local coil. The induced voltage is amplified with a low-noise preamplifier (e.g., LNA, preamp) and is routed to the receiving electronics. In order to improve the signal-to-noise ratio even with high resolution images, high field systems may be used (e.g., 1.5 T-12 T or more). If more individual antennae may be connected to an MR receiving system than receivers are available, a switching matrix (e.g., an RCCS) is, for example, built in between receiving antennae and receiver. The switching matrix routes the momentarily active receiving channels (e.g., the receiving channels that lie in the field of view of the magnet) to the existing receiver. As a result, more coil elements than there are receivers present may be connected, since, with a whole body coverage, only the coils found in the FoV and/or in the homogeneity volume of the magnet are to be read out.

An antenna system may be a local coil arrangement 106 that, for example, may includes one or, as an array coil, a number of antenna elements (e.g., coil elements. The individual antenna elements may, for example, be embodied as loop antennae (e.g., loops), butterfly antennae, flexible coils, or saddle coils. A local coil arrangement includes, for example, coil elements, a preamplifier, further electronics (e.g., baluns), a housing, overlays, and may include a cable with a plug for connecting to the MRT system. A receiver 168 attached on the system side filters and digitizes a signal received by a local coil 106 (e.g., by radio) and transfers the digitized signal (e.g., data) to a digital signal processing device or system. The digital signal processing device derives an image or a spectrum from the data obtained by the measurement and is available to the user, for example, for subsequent diagnosis and/or storage.

FIGS. 3-10 show embodiments of local coils for MM imaging (e.g., abdominal MRI imaging) and the use of the local coils on patients.

Exemplary embodiments of local coils 106 according to FIGS. 3-10 enable a patient 105 to "wear" the local coil on his/her torso or body (e.g., on the back, stomach, and/or chest). The local coil 106 is worn like a piece of upper body clothing such as, for example, a vest or jacket. The local coil 106 may be put on the patient before he/she lies on the MRT patient couch 104.

Figure 10:
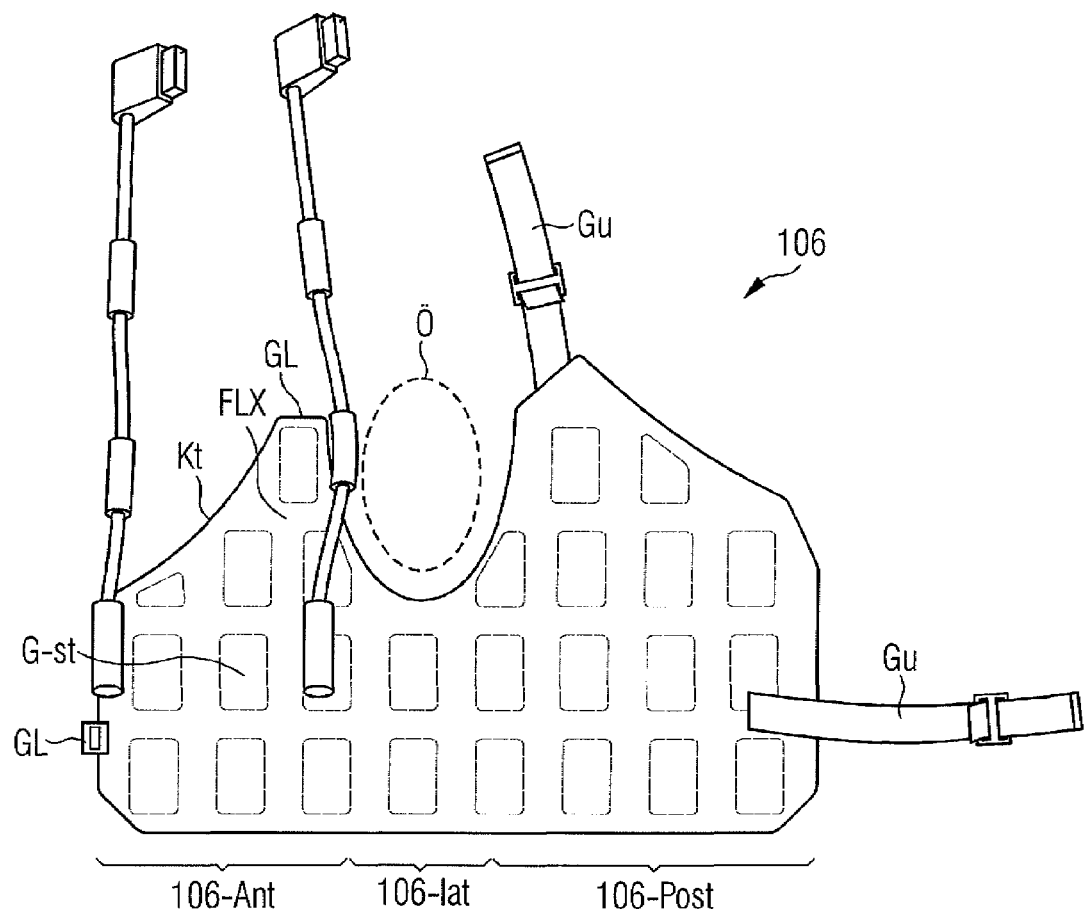
FIG. 10 shows a top view of an embodiment of a local coil broadly uncoiled.

An exemplary embodiment of a local coil 106 may be structured to be mechanically flexible according to FIG. 10 (e.g., at least in one region FLX) and includes antennae and may include additional electronics such as, for example, one or more preamplifiers, mixers, ADC(s) and detuning circuit(s) in, for example, rigid housing areas G-st of the local coil antennae (e.g., local coil transmit and/or receive antennae).

An exemplary embodiment of a local coil 106 covers the patient from three or four sides (e.g., dependent on the build of the patient). For optimal adaptation to the body geometry of the patient 105, a local coil includes, for example, one or two openings O (e.g., shown dashed in FIG. 10; material-free regions indicated as ellipsis) in order for the arm to pass through when the patient is "wearing" the local coil and two or more closing mechanisms Gu, GL for adapting the local coil 106 to the respective patient 105.

The closing mechanisms Gu, GL may be embodied, for example, as belts GU that may be adjusted in terms of length (e.g., for a belt buckle GL) or as mechanically flexible elements (e.g., made of rubber or a springy material). Adaptation to the individual anatomy of patients may take place, for example, using adjustable belts Gu or similar solutions on the shoulder (e.g., in a cranial direction) and/or laterally (e.g., at hip height).

A first mechanism (e.g., belt(s) Gu over the shoulder) is used so that the local coil 106 sits high enough, and coil elements of the local coil are positioned effectively below the armpit. A second mechanism (e.g., belt(s) Gu on the hip) is used so that the local coil 106 rests sufficiently tightly around the patient in the peripheral direction (see FIGS. 6-8).

Figure 1:
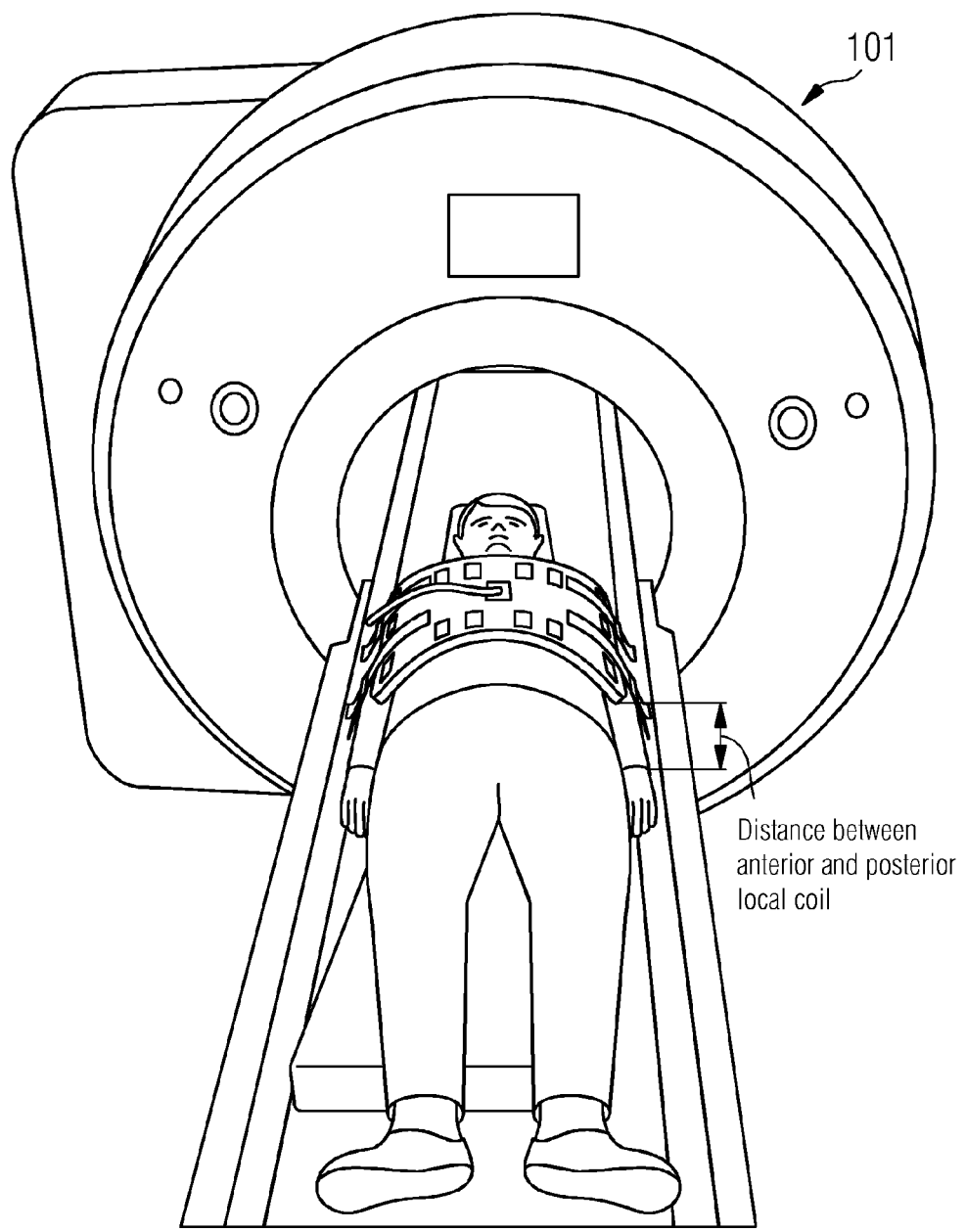
FIG. 1 shows a patient to be examined having a local coil on an MRT couch.
Figure 2:
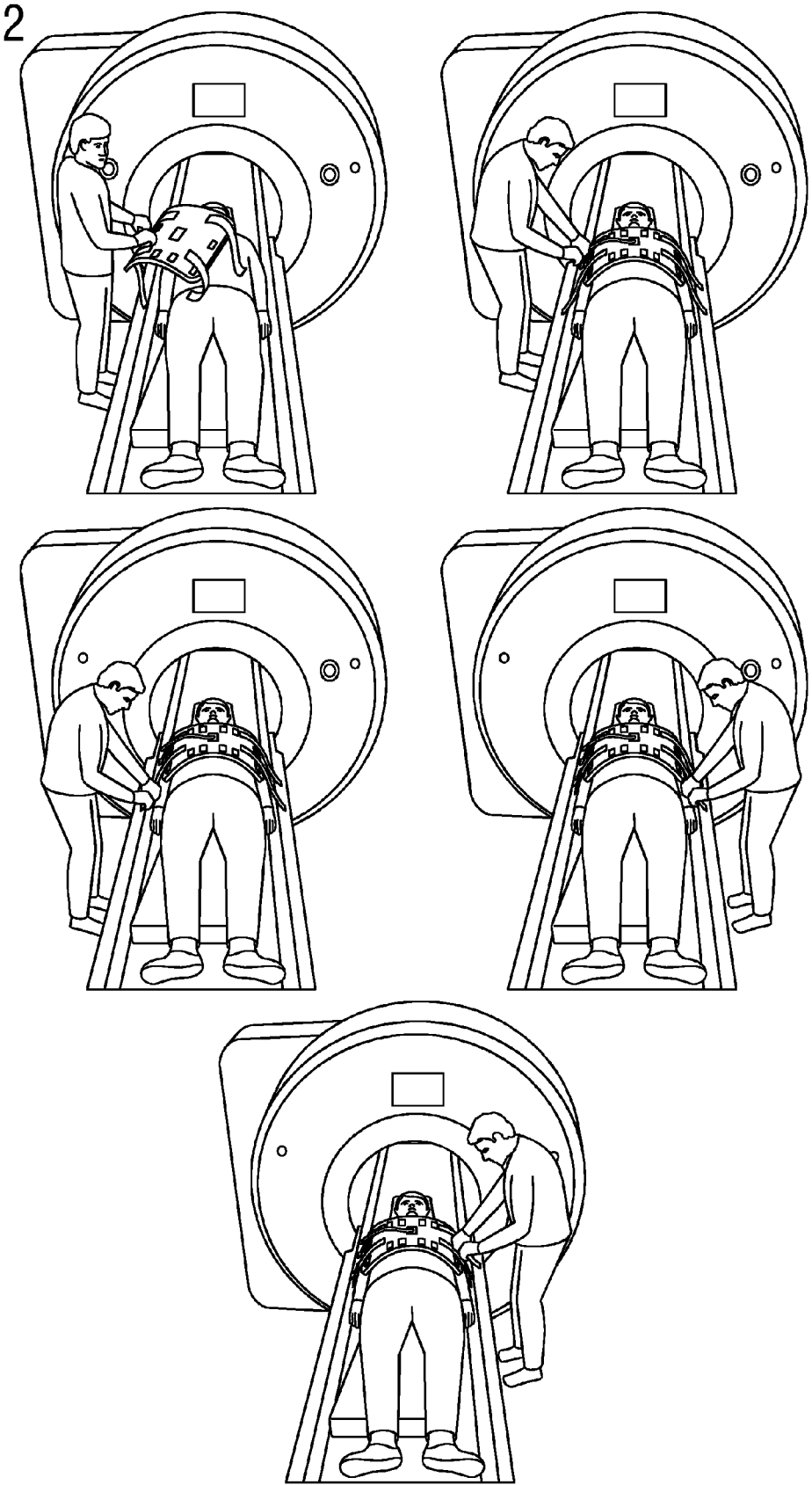
FIG. 2 shows a patient to be examined and a local coil that is fixed to a magnetic resonance tomograph (MRT) couch.
Figure 3:
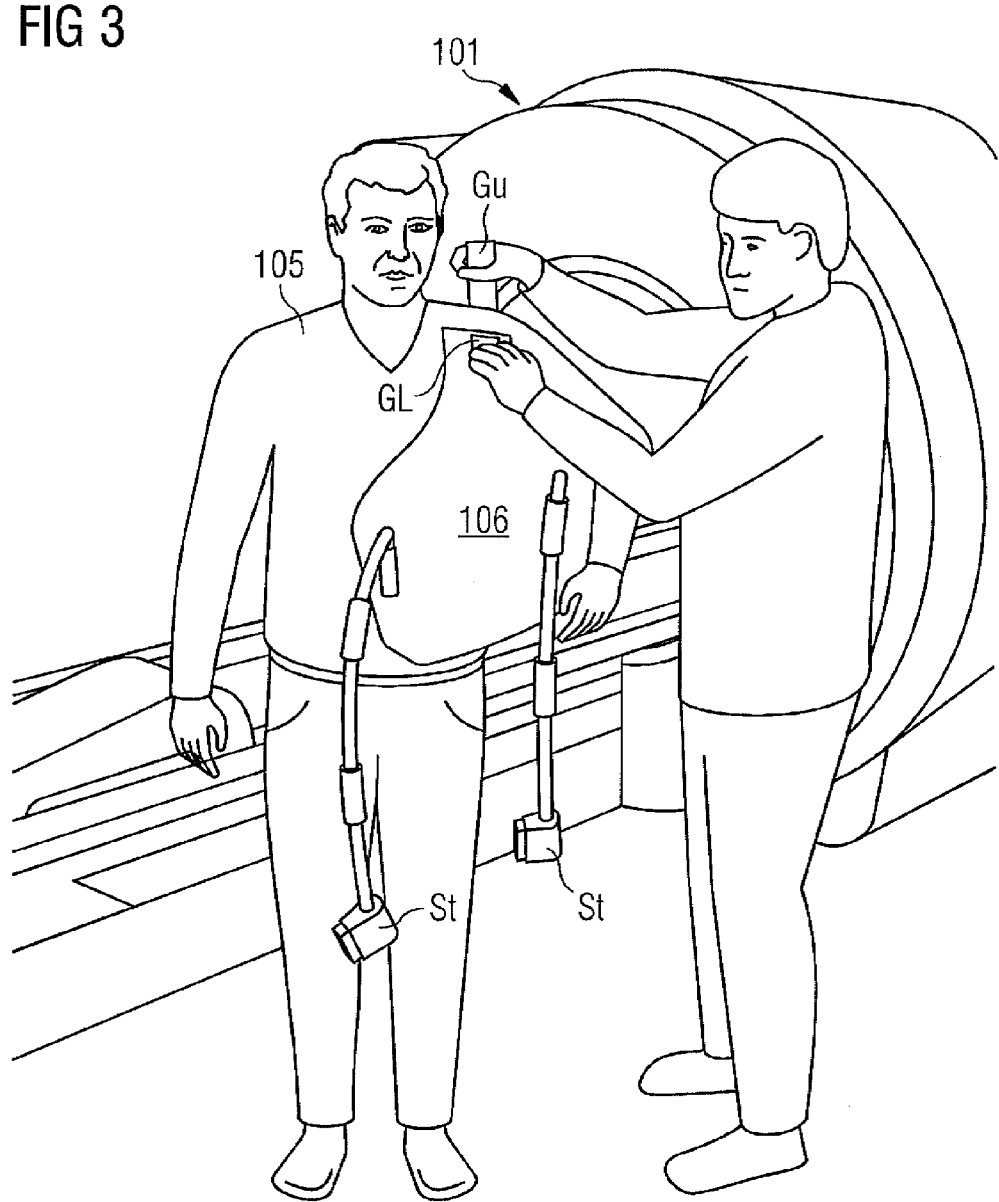
FIG. 3 shows one embodiment of a local coil with a belt that is suspended on one shoulder of a patient to be examined.
Figure 4:
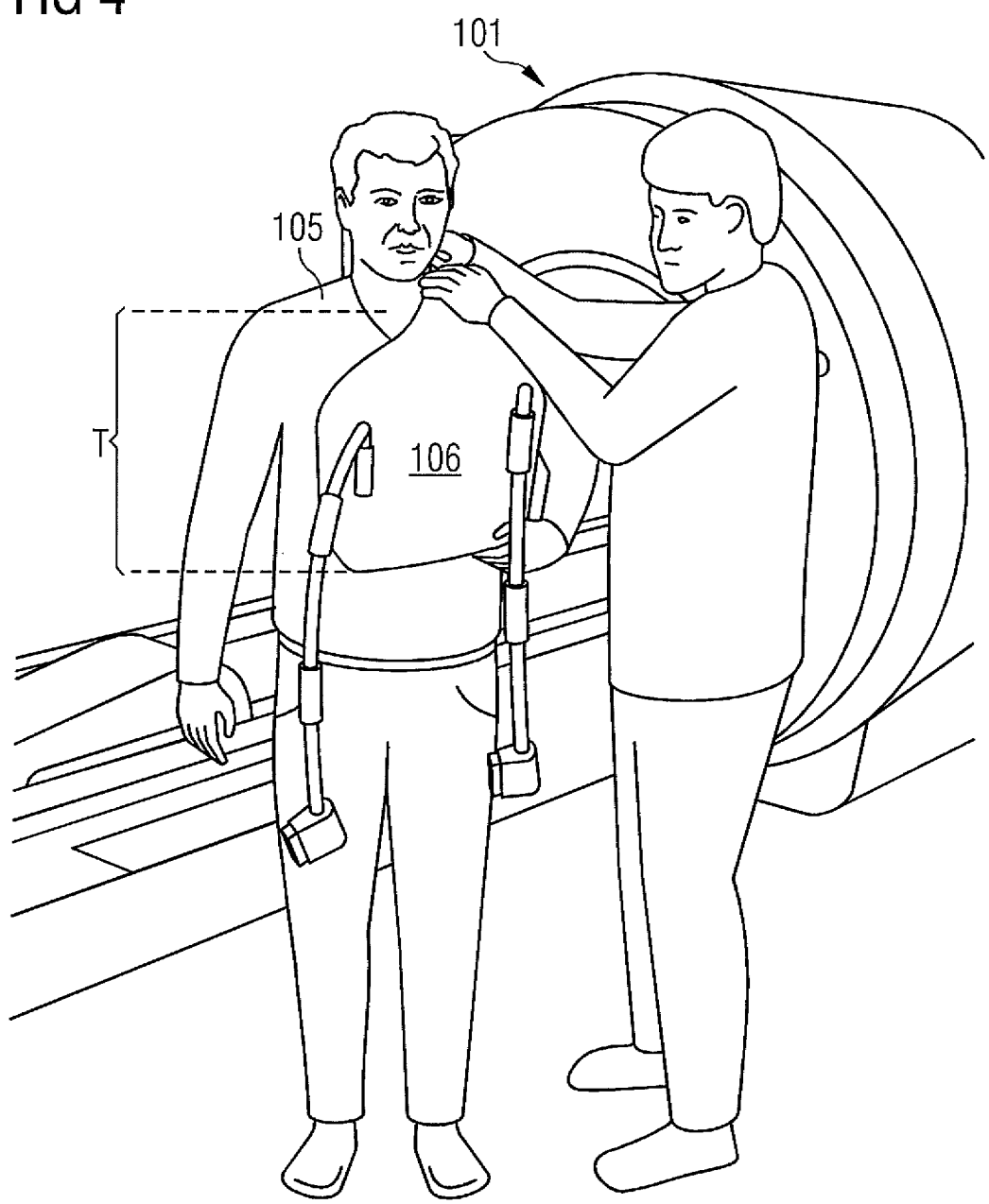
FIG. 4 shows a patient to be examined, on which one embodiment of a local coil is positioned.
Figure 5:
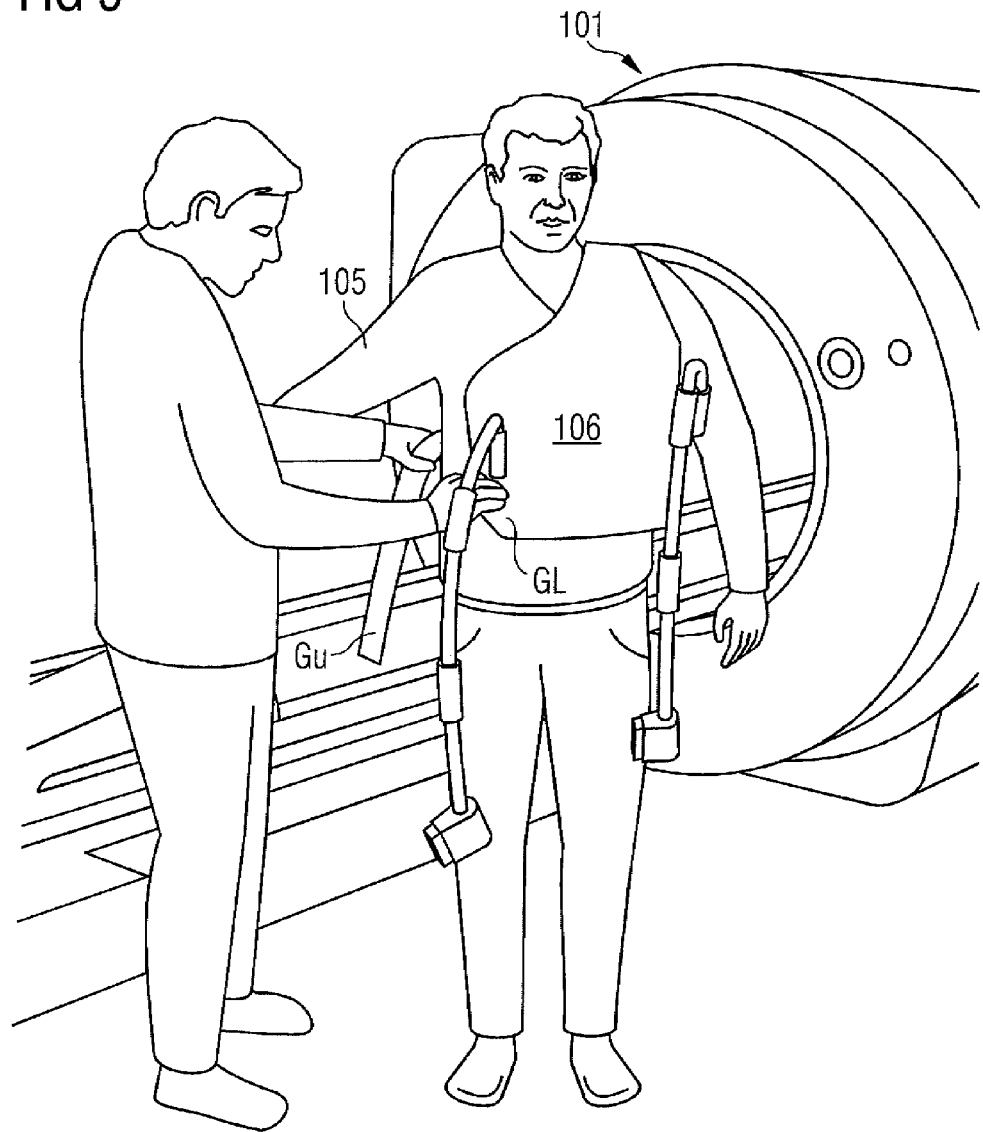
FIG. 5 shows a patient to be examined having one embodiment of a local coil suspended over one shoulder, an anterior part and a part of the local coil being connected to one another by a belt.
Figure 6:
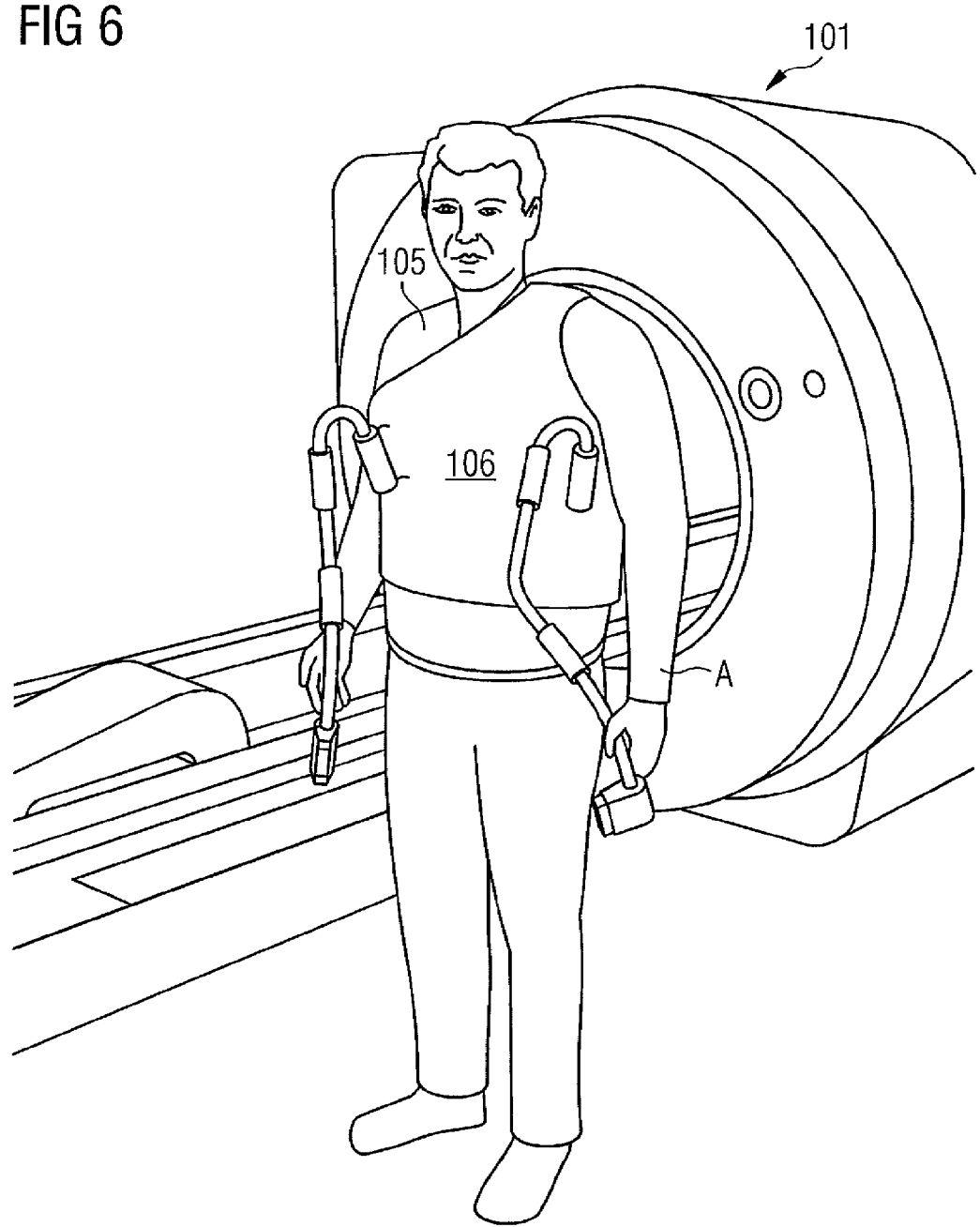
FIG. 6 shows an anterior view of a patient to be examined having one embodiment of a local coil worn like a vest.
Figure 7:
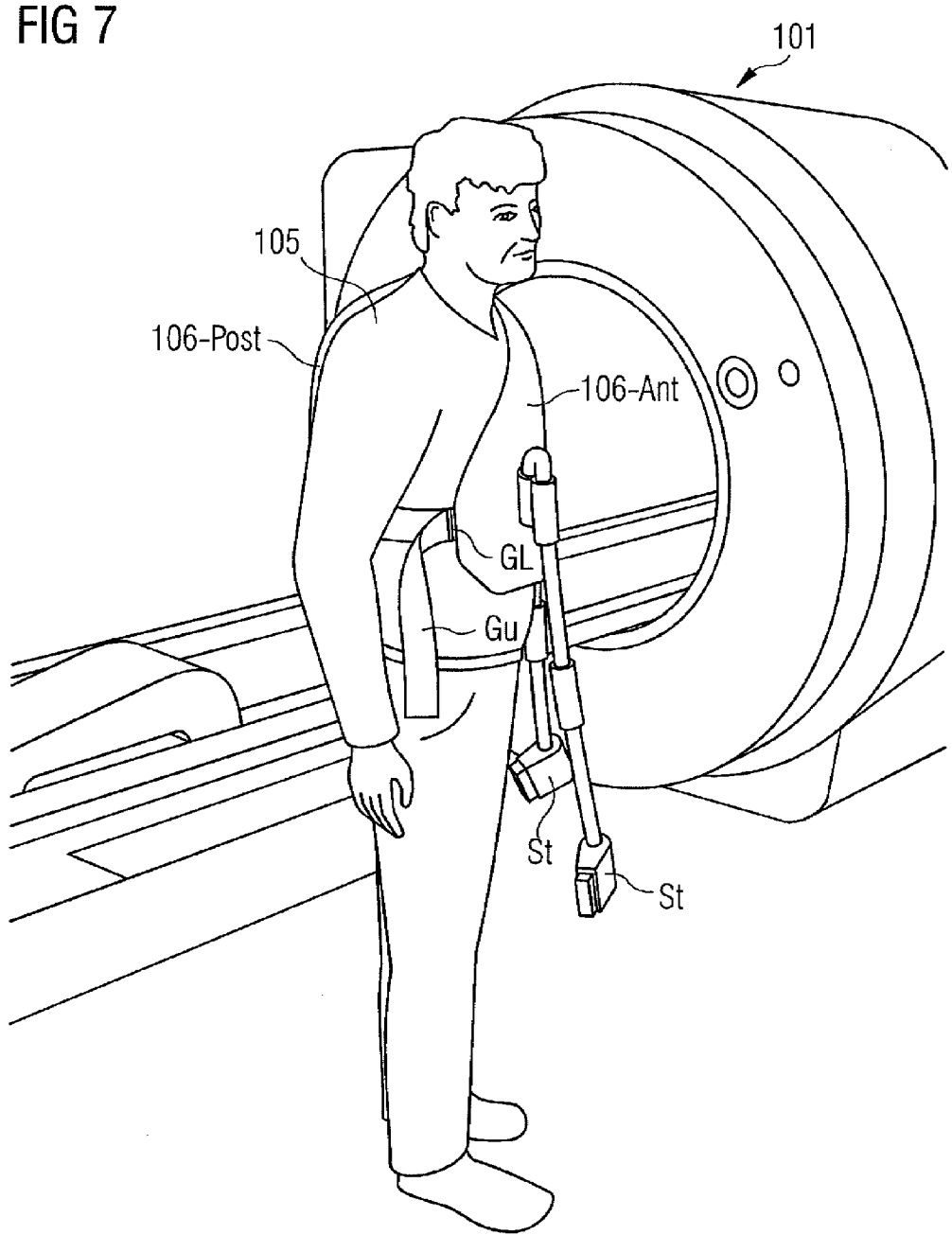
FIG. 7 shows a lateral view of a patient to be examined having one embodiment of a local coil worn like a vest.
Figure 8:
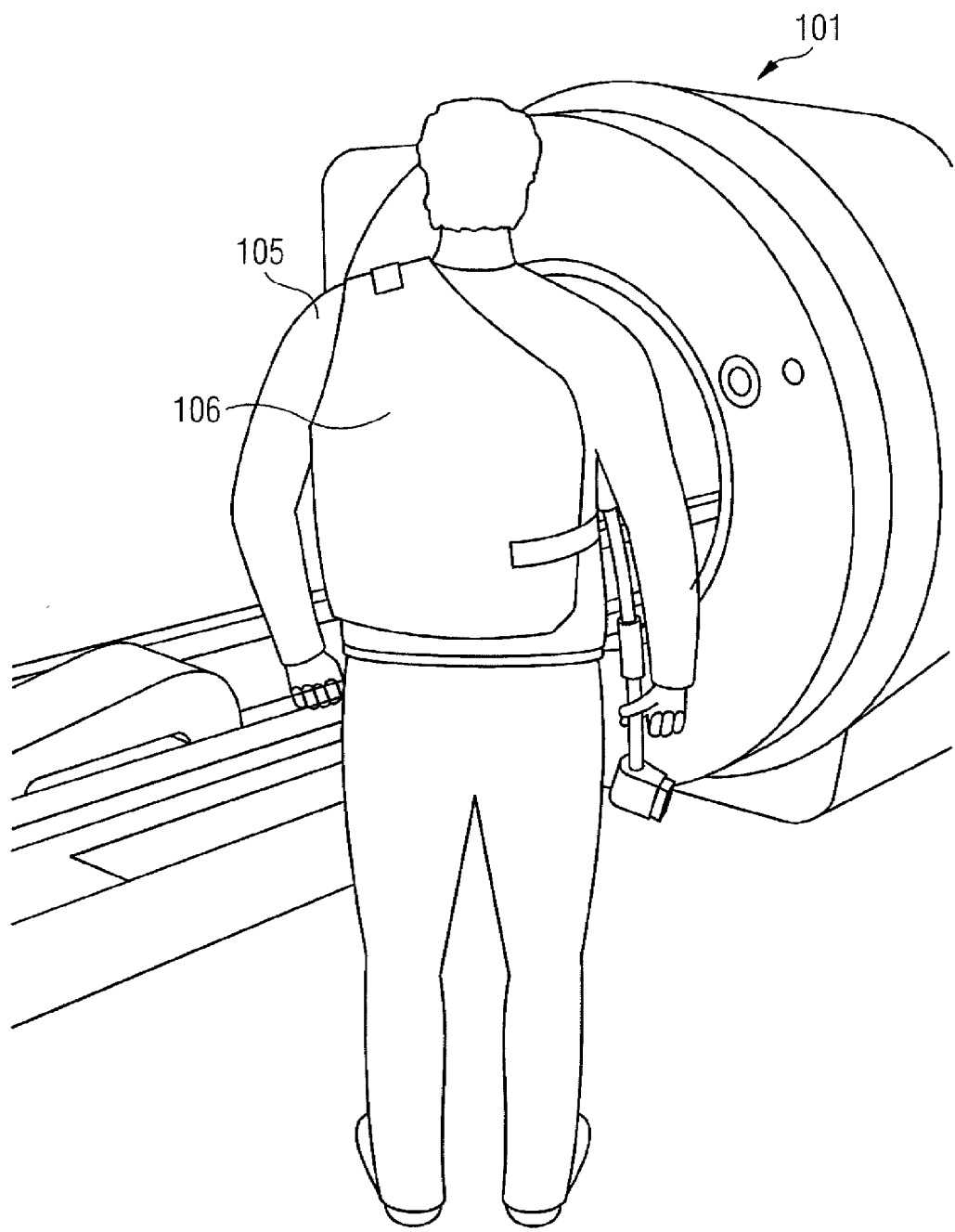
FIG. 8 shows a posterior view of a patient to be examined having one embodiment of a local coil worn like a vest.
Figure 9:
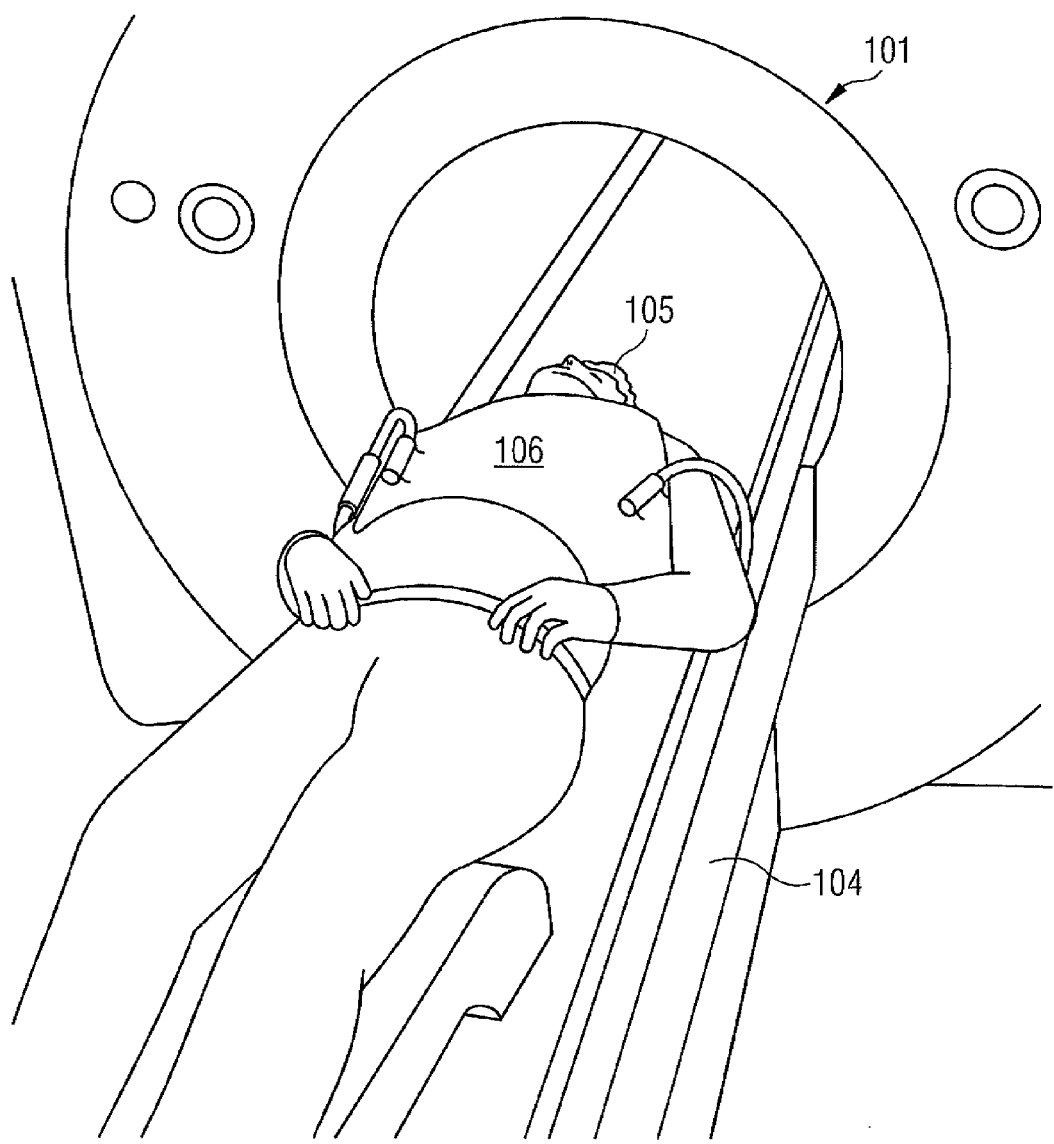
FIG. 9 shows a patient to be examined having one embodiment of a local coil worn like a vest, lying on an MRT couch.

The problems cited in the introduction regarding at least internally known local coils (according to FIGS. 1 and 2) may therefore be improved or resolved. Specifically, all positioning and fastening measures may take place prior to examination and outside of the examination room. This reduces installation and personnel costs for the examination by a corresponding time saving.

One possible advantage lies in a mechanical embodiment of an abdomen coil, which similarly to a jacket or a vest, may be worn prior to positioning of the patient 105 on the patient couch 104 of the MRT 101. In addition to saving on set-up time, a local coil 106 optimizes the SNR due to the effectively adjustable anatomical fit for patients with varying geometries.

In FIG. 10, the local coil 106 is adapted such that part of the local coil 106 lies between the abdomen (e.g., torso) of the patient 105 and an arm A of the patient 105.

The local coil 106 includes a flexible planar anterior region 106-ant (e.g., an anterior torso part) with antennae, and a planar posterior region 106-post (e.g., a posterior torso part) with antennae. A region 106-lat may rest laterally on one side of the patient between the abdomen/chest region and an arm A of the patient.

As shown in FIG. 10, a lateral part or a lateral subpiece 106-lat of the local coil 105 fixedly connects the anterior torso part 106-ant and the posterior torso part 106-post of the local coil (e.g., on one side of the patient) (e.g., without damage, not so detachable as in the case of belts). Alternatively, the anterior and posterior subpieces may be detachably connected with one another by buttons or zip fasteners or belts in the side subarea when the local coil rests on a patient (see FIGS. 3-9) and also when the local coil does not rest on the patient (see FIG. 10). The belts Gu connect the anterior torso part 106-ant and posterior torso part 106-post of the local coil (e.g., on one side of the patient) detachably to one another when the local coil rests on the patient (FIGS. 3-9).

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for an imaging system, the local coil comprising:
    an anterior torso part;
    a posterior torso part;
    a first adjustable and detachable closing mechanism configured to connect the anterior torso part to the posterior torso part at a first shoulder of a patient between a neck of the patient and a first shoulder opening for an arm of the patient to pass through; and
    a second adjustable and detachable closing mechanism configured to connect the anterior torso part to the posterior torso part below a second shoulder of the patient laterally at hip height, in abdominal region, or at a chest region of the patient,
    wherein the anterior torso part and the posterior torso part are not configured to be connected at the second shoulder of the patient.

2. The local coil as claimed in claim 1, wherein the local coil is a magnetic resonance tomography (MRT) local coil.

3. The local coil as claimed in claim 1, wherein the local coil is configured as a piece of upper body clothing.

4. The local coil as claimed in claim 1, wherein the local coil is in the form of a vest that surrounds part of the torso of the patient.

5. The local coil as claimed in claim 1, wherein the local coil is in the form of a wearable jacket with a single sleeve.

6. The local coil as claimed in claim 1, wherein the local coil is in the form of a piece of upper body clothing that surrounds a body of the patient when worn anterior in the chest region, in the abdominal region, or in the chest region and in the abdominal region.

7. The local coil as claimed in claim 1, wherein the local coil is in the form of a piece of upper body clothing that surrounds a body of the patient when worn as a piece of clothing in the chest region, in the abdominal region, or in the chest region and in the abdominal region along a periphery about a longitudinal axis of the body.

8. The local coil as claimed in claim 1, wherein the first adjustable and detachable closing mechanism or the second adjustable and detachable closing mechanism is a fastener.

9. The local coil as claimed in claim 1, wherein the local coil is an abdominal region coil, a heart coil, a chest coil, or a combination thereof.

10. The local coil as claimed in claim 1, further comprising a planar anterior region with antennae, a planar posterior region with antennae, or the planar anterior region with antennae and the planar posterior region with antennae.

11. The local coil as claimed in claim 1, further comprising a high frequency (HF) field receiving antenna anterior in the abdominal region, the chest region, or the abdominal region and the chest region of the patient, posterior in a back region of the patient, or a combination thereof.

12. The local coil as claimed in claim 1, further comprising a planar region with antennae, electronics, and the first adjustable and detachable closing mechanism or the second adjustable and detachable closing mechanism.

13. The local coil as claimed in claim 1, further comprising one or more additional closing mechanisms operable for adapting the local coil to different patients.

14. The local coil as claimed in claim 1, wherein the first adjustable and detachable closing mechanism and the second adjustable and detachable closing mechanism are operable for adapting to different anatomies of different patients.

15. The local coil as claimed in claim 1, wherein the first adjustable and detachable closing mechanism and the second adjustable and detachable closing mechanism are belts.

16. The local coil as claimed in claim 1, further comprising belts and belt buckles.

17. The local coil as claimed in claim 1, wherein the first adjustable and detachable closing mechanism and/or the second adjustable and detachable closing mechanism comprises a pair of belts and belt buckles, a first part of each pair being located on the anterior torso part and a second part of each pair being located on the posterior torso part.

18. The local coil as claimed in claim 1, wherein the first adjustable and detachable closing mechanism and the second adjustable and detachable closing mechanism are belts attached to the local coil laterally with reference to the patient when attached to the patient,
wherein each of the belts is guidable around a longitudinal axis of the patient relative to a belt buckle.

19. The local coil as claimed in claim 1, wherein the first adjustable and detachable closing mechanism comprises one or more belts attached to a side of the local coil near a head in a state attached to the patient,
wherein the one or more belts are guidable around an axis extending through the first and second shoulders of the patient.

20. The local coil as claimed in claim 19, wherein the one or more belts are guidable around the axis extending through the first and second shoulders of the patient, such that a first part of the local coil positionable on a stomach/chest side of the patient is fastened to a second part of the local coil positionable on a rear side of the patient.

21. The local coil as claimed in claim 1, wherein the first adjustable and detachable closing mechanism and the second adjustable and detachable closing mechanism comprise belts, the belts being adjustable in length, adjustable by mechanically flexible elements, or adjustable in length and by the mechanically flexible elements.

22. The local coil as claimed in claim 21, wherein the belts are made of rubber of a spring material.

23. The local coil as claimed in claim 1, wherein a part of the local coil lies between the abdomen and the arm of the patient in a state worn by the patient.

24. The local coil as claimed in claim 1, wherein the anterior torso part extends from the abdominal region to the first shoulder of the patient.

25. The local coil as claimed in claim 1, wherein the posterior torso part extends at least from a rear side of the abdominal region to the first shoulder of the patient.

26. The local coil as claimed in claim 1, wherein an edge of a front side of the local coil is oriented at an angle of 10-70 degrees oblique to a longitudinal axis of the patient on the neck of the patient.

27. The local coil as claimed in claim 1, wherein a planar front side, a planar rear side, or the planar front side and the planar rear side of the local coil are mechanically flexible.

28. The local coil as claimed in claim 1, wherein a planar front side, a planar rear side, or the planar front side and the planar rear side of the local coil comprise antennae, electronics, or the antennae and the electronics.

29. The local coil as claimed in claim 28, wherein the electronics comprise a preamplifier, a mixer, an analog-to-digital converter (ADC), a detuning circuit, or a combination thereof.

30. The local coil as claimed in claim 1, wherein the local coil at least partially covers the torso of the patient on three sides.

31. The local coil as claimed in claim 1, wherein the local coil covers the torso of the patient on four sides, anteriorly, dorsally and laterally on both sides.

32. The local coil as claimed in claim 1, further comprising:
a lateral torso part, wherein the lateral torso part of the local coil connects the anterior torso part and the posterior torso part to one another below the first shoulder opening at hip height, in the abdominal region, or at the chest region of the patient.

* * * * *